(12) United States Patent
Lin

(10) Patent No.: US 6,336,497 B1
(45) Date of Patent: Jan. 8, 2002

(54) SELF-RECIRCULATED HEAT DISSIPATING MEANS FOR COOLING CENTRAL PROCESSING UNIT

(76) Inventor: Ching-Bin Lin, 2F-2, No. 12, Lane 88, Min-Sheng E. Road, Sec. 3, Taipei 104 (TW)

( * ) Notice: Subject to any disclaimer, the term of this patent is extended or adjusted under 35 U.S.C. 154(b) by 0 days.

(21) Appl. No.: 09/722,750

(22) Filed: Nov. 24, 2000

(51) Int. Cl.[7] ................................................. F28F 7/00
(52) U.S. Cl. ................................ 165/80.3; 165/104.21; 165/104.33; 361/700; 361/697; 257/715; 257/719
(58) Field of Search ........................... 165/80.3, 104.21, 165/104.26, 104.33, 185, 121, 114.32; 361/697, 700; 257/715, 722, 718, 719

(56) References Cited

U.S. PATENT DOCUMENTS

| | | | | |
|---|---|---|---|---|
| 3,741,292 A | * | 6/1973 | Dakala et al. | 165/104.33 |
| 4,053,942 A | * | 10/1977 | Dougherty, Jr. et al. | 257/719 |
| 4,951,740 A | * | 8/1990 | Peterson et al. | 165/104.26 |
| 5,375,652 A | * | 12/1994 | Matsunaga et al. | 257/719 |
| 5,529,115 A | * | 6/1996 | Paterson | 165/104.33 |
| 5,661,637 A | * | 8/1997 | Villaume | 165/104.26 |
| 5,959,837 A | * | 9/1999 | Yu | 165/80.3 |
| 6,019,167 A | * | 2/2000 | Bishop et al. | 165/80.3 |

FOREIGN PATENT DOCUMENTS

| JP | 404023457 | * | 1/1992 | 257/722 |
|---|---|---|---|---|

* cited by examiner

Primary Examiner—Christopher Atkinson

(57) ABSTRACT

A heat dissipating device includes: a barrel having a plurality of fins circumferentially formed on a barrel wall; a buckle secured on a first end portion of the barrel to be fastened to a base board of a central processing unit (CPU); a cooling fan provided at a second end portion of the barrel for directing cooling air through the barrel wall and the fins for dissipating heat outwardly as emitted from the CPU which is adhered to the first end portion of the barrel; a vaporizable coolant filled in the barrel; and a transfer member fixed in the barrel for conducting the heat from the CPU to the vaporizable coolant for vaporizing the coolant in order to greatly absorb a vaporization heat during the phase change from the liquid coolant to the coolant vapor, whereby upon contact of the coolant vapor with the barrel wall as cooled by the cooling fan, the coolant vapor will be condensed to liberate the condensation heat which will soon be dissipated through the barrel wall and the fins by the cooling air as delivered from the fan for efficiently cooling the central processing unit.

11 Claims, 3 Drawing Sheets

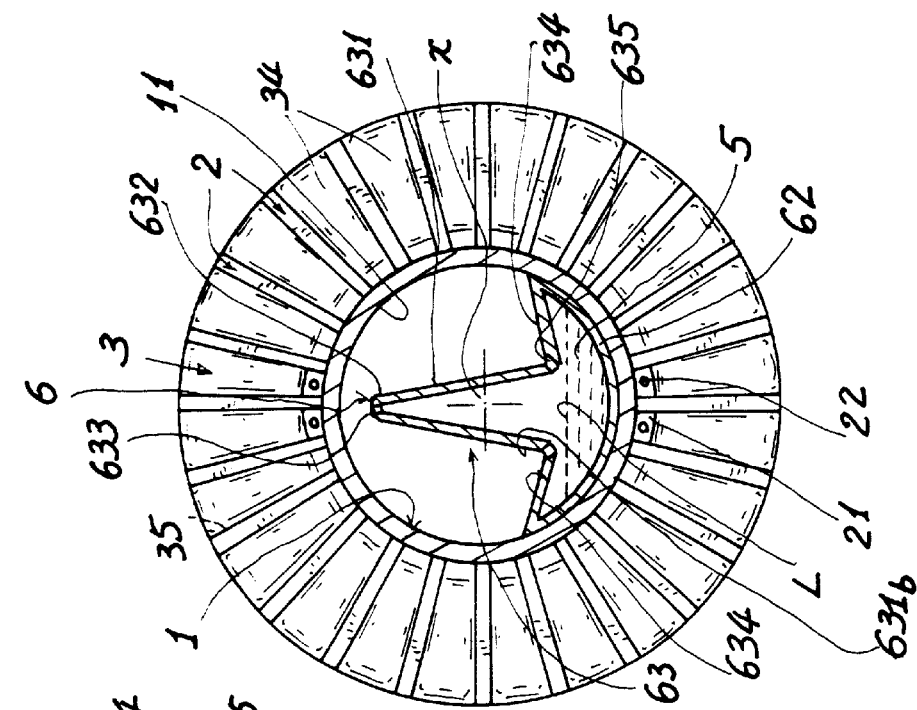
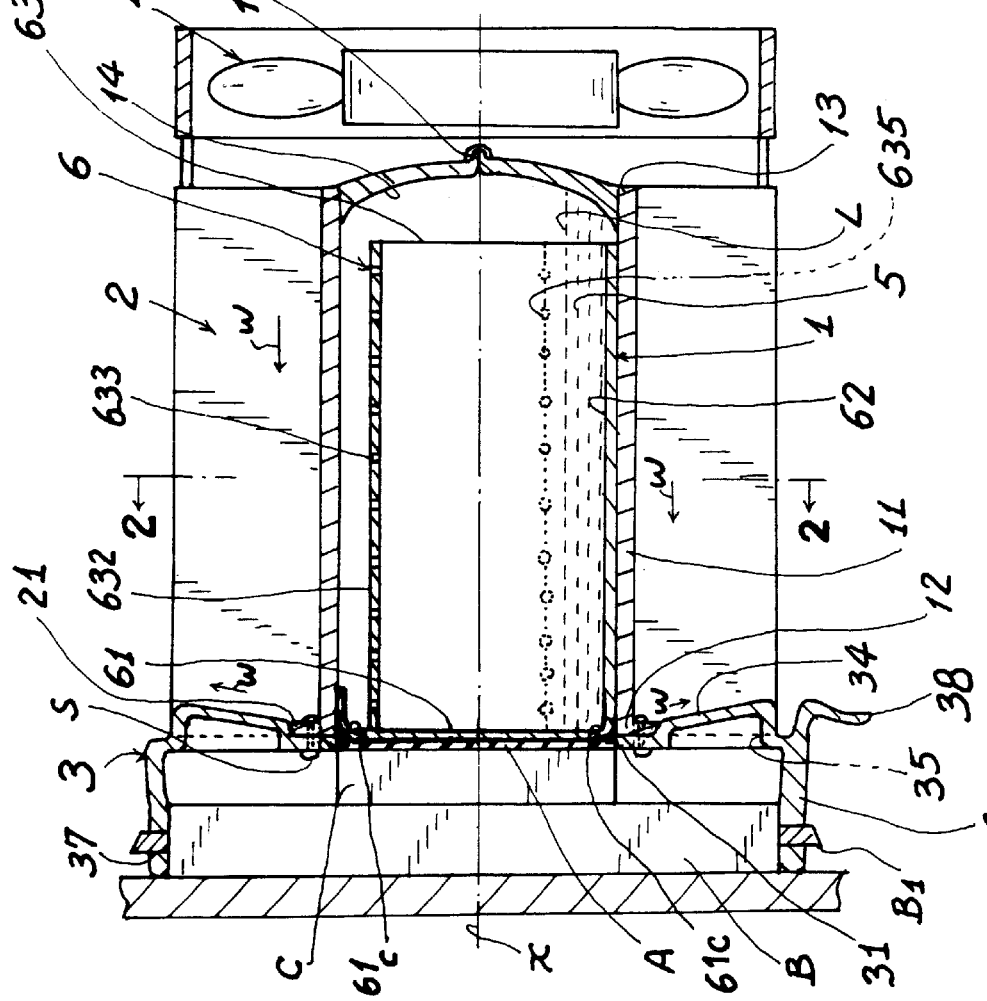

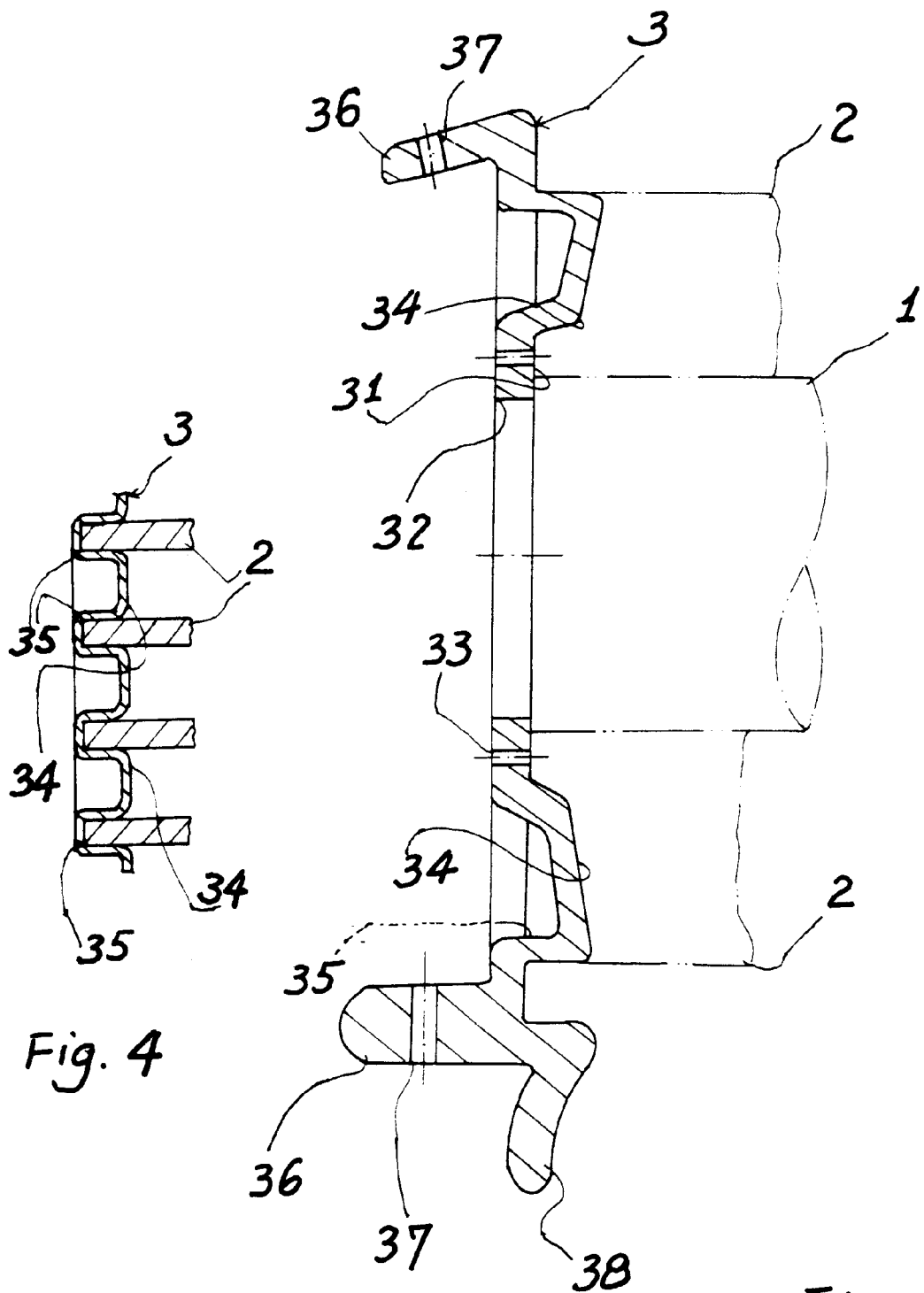

SELF-RECIRCULATED HEAT DISSIPATING MEANS FOR COOLING CENTRAL PROCESSING UNIT

BACKGROUND OF THE INVENTION

A conventional fin-type heat dissipating device having a plurality of fins and a cooling fan is provided for cooling a central processing unit (CPU) of a computer. However, it may only dissipate the sensible heat (not latent heat) from a CPU. Its cooling effect is therefore quite limited.

Even a conventional heat exchanger may be installed on a CPU to apply a water flow through the heat exchanger to absorb and dissipate the heat from the CPU. However, the heat exchanger provided with a forced circulation of water flow therethrough will require a complex, heavy and expensive equipment or system, especially not suitable for portable or personal computers.

The present inventor has found the drawbacks of the conventional heat dissipating device for CPU, and invented the present self-recirculated heat dissipating means for cooling central processing unit.

SUMMARY OF THE INVENTION

The object of the present invention is to provide a heat dissipating device including: a barrel having a plurality of fins circumferentially formed on a barrel wall; a buckle secured on a first end portion of the barrel to be fastened to a base board of a central processing unit (CPU); a cooling fan provided at a second end portion of the barrel for directing cooling air through the barrel wall and the fins for dissipating heat outwardly as emitted from the CPU which is adhered to the first end portion of the barrel; a vaporizable coolant filled in the barrel; and a transfer member fixed in the barrel for conducting the heat from the CPU to the vaporizable coolant for vaporizing the coolant in order to greatly absorb a vaporization heat during the phase change from the liquid coolant to the coolant vapor, whereby upon contact of the coolant vapor with the barrel wall as cooled by the cooling fan, the coolant vapor will be condensed to liberate the condensation heat which will soon be dissipated through the barrel wall and the fins by the cooling air as delivered from the fan for efficiently cooling the central processing unit.

BRIEF DESCRIPTION OF THE DRAWINGS

FIG. 1 is a sectional drawing of the present invention when the central processing unit is vertically mounted.

FIG. 2 is a cross sectional drawing of the present invention as viewed from 2—2 direction of FIG. 1.

FIG. 3 is an enlarged sectional-drawing of the buckle means of the present invention.

FIG. 4 is an illustration showing the engagement of the fins with the concave portions and convex portions of the buckle means of the present invention.

DETAILED DESCRIPTION

Figure 6:
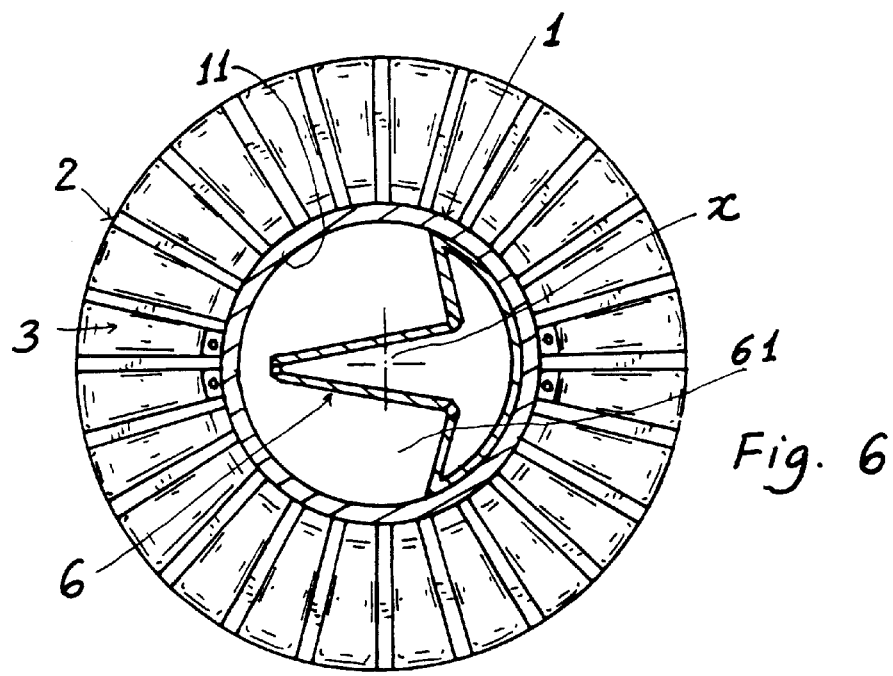
FIG. 6 is a cross sectional drawing of the present invention as viewed from 6—6 direction of FIG. 5.

As shown in FIGS. 1~4, the present invention comprises: a barrel 1; a plurality of fins 2 circumferentially formed or radially formed on a barrel wall 11 of the barrel 1; a buckle means 3 secured on a first end portion 12 of the barrel 1 and fastened to a base board B of a central processing unit (CPU) C; a cooling fan 4 secured to a second end portion 13 of barrel 1 (or the fan 4 secured to the fins 2 adjacent to the second end portion 13 of the barrel 1, opposite to the first end portion 12; a vaporizable coolant 5, which may be selected from water or other coolants vaporizable at low temperature or at low pressure, filled in the barrel 1 in which the air is sucked to form a vacuum before the filling of the coolant 5; and a transfer means 6 integrally formed in the barrel 1. The barrel 1 and the cooling fan 4 define a longitudinal axis X at their longitudinal center.

The barrel 1 may be formed as a cylindrical shape, a polygonal shape, or any other suitable shapes. The barrel 1 includes a barrel wall 11, a first end portion 12 adjacent to the central processing unit (CPU) C, and a second end portion 13 adjacent to the cooling fan 4. The barrel 1 may be made of aluminum alloy or other materials having high heat conductivity.

The fins 2 may be made of aluminum alloy or other materials having high heat conductivity. The fins 2 may be integrally formed with the barrel 1 as shown in FIG. 2. The fins 2 may be radially protruded from the barrel wall 11 of the barrel 1. Other modifications may be made for forming the fins 2 on the barrel 1, not limited in the present invention.

The buckle means 3 includes: a central disk portion 31 secured on a first end portion 12 of the barrel 1; a central hole 32 formed through a central portion of the central disk portion 31 for protruding an end portion of the transfer means 6 through the central hole 32 to be connected to the central processing unit (CPU) C by a thermally conductive adhesive A (or other joining methods or materials); a plurality of bolt holes 33 formed in the central disk portion 31 for passing a plurality of bolts or screws S through the bolt holes 33 and through a plurality of fixing holes 22 each formed in a web portion 21 formed among two neighboring fins 2 and the first end portion 12 of the barrel 1 for securing the central disk portion 31 of the buckle means 3 with the barrel 1 and the fins 2; a plurality of convex portions 34 and concave portions 35 alternatively circumferentially formed on the central disk portion 31 with each concave portion 35 engaging each fin 2 and with every two convex portions 34 clamping each fin 4 in between the two convex portions 34 especially as shown in FIG. 4; two clamping members 36 respectively formed on opposite side portions of the central disk portion 31 each clamping member 30 having a tenon hole 37 formed therein for engaging a tenon B1 protruding sidewardly from the base board B of the CPU (C) for securing the buckle means 3 on the base board B; and at least a lug 38 formed on one said clamping member 36 which serves as a "handle" for adjusting, moving, assembling or disassembling the buckle means 3 when coupled with or uncoupled from the base board B.

The clamping member 36 may be formed as an elastic spring arm defining an acute angle with the central disk portion 31 in order to resiliently clamp the base board B of CPU (C).

The transfer means 6 includes: a heat-conducting end plate 61 secured on the first end portion 12 of the barrel 1 and protruding through the central hole 32 of the buckle means 3 to be joined with the CPU (C) by adhesive A, with the end plate 61 substantially sealing an end opening of the first end portion 12 of the barrel 1; a heat transfer base plate 62 tightly secured on or integrally formed on an inside surface of the barrel wall 11 and being perpendicular to the heat-conducting end plate 61; and a guiding member 63 connected with the heat transfer plate 62 and the heat-conducting end plate 61 for guiding coolant vapor as vaporized from the vaporizable liquid coolant 5 as accumulated in a lower portion of the barrel 1 or accumulated on the heat transfer base plate 62 on the barrel 1 towards an inside surface of the barrel wall 11 (opposite to said base plate 62), whereby the vapor will then be cooled, condensed and drained as a liquid coolant along the barrel wall to the lower portion of the barrel 1 for a self recirculation of the coolant 5.

The heat-conducting end plate 61 may be formed as an arcuate convex portion 61C protruding arcuately towards the CPU to be resiliently fastened with the CPU to enhance a buffer effect for dampening the contacting pressure between the CPU and the end plate 61, thereby preventing damage or deformation of the CPU.

All the elements of the end plate 61, the heat transfer base plate 62, and the guiding member 63 of the transfer means 6 may be integrally formed. They may be made of materials of high thermal conductivity including copper.

The guiding member 63 includes: a middle guiding portion 631 tapered from the heat transfer base plate 62 towards the barrel wall 11 above a liquid level L of the vaporizable coolant 5 originally accumulated on the heat transfer base plate 62; a tapered end portion 632 formed on an end of the middle guiding portion 631 having a plurality of end perforations 633 formed in the tapered end portion 532; a pair of side guiding portions 634 disposed on opposite sides of the middle guiding portion 631 each side guiding portion 634 inclined from each end of opposite ends of the base plate 62 towards the middle guiding portion 631 to be connected with a base portion 631b of the middle guiding portion 631; a plurality of base perforations 635 formed in a boundary portion between the middle guiding portion 631 and each side guiding portion 634 as shown in FIG. 2.

The guiding member 63 is formed as an inversed T shape as shown in FIG. 2. Naturally, other shapes or structures of the guiding member 63 may be further modified or designed, not limited in the present invention.

As shown in FIGS. 1 & 2, the CPU is vertically mounted on a base board and is perpendicular to the level L of the vaporizable liquid coolant 5 (which may be water) as accumulated on a lower portion (namely, on the base plate 62) in the barrel 1. When CPU produces heat, the heat will be transferred through the end plate 61 and the base plate 62 to the liquid coolant 5 which will absorb the heat to vaporize under lower temperature under vacuum within the barrel 1. The vapor as vaporized from the coolant whenever absorbing the heat of vaporization will be directed upwardly through the tapered middle guiding portion 631 to be sprayed upwardly through the end perforations 633 formed in the tapered end portion 632. The vapor will be sprayed or atomized towards the barrel wall 11 to be cooled and condensed since the barrel wall 11 and the fins 2 are cooled by the cooling air as driven by the cooling fan 4. The vapor of the coolant, when condensed to be liquid (water) droplets, will liberate heat of condensation on the barrel wall through which the heat will be immediately dissipated by the cooling air streamflow W as directed from the fan 4 through the fans 2 and the barrel wall 11.

The convex portions 34 on the buckle means 3 are inclined outwardly as angularly biased to be separated from the CPU (C) to guide the air streamflow W outwardly, without intrusion towards the CPU, to efficiently dissipate the heat outwardly from the CPU.

The liquid (water) droplets as cooled on the inside surface of the barrel wall 11 will be drained downwardly along the arcuate inside surface of the barrel wall onto the inclined side guiding portions 634. The liquid coolant will then be gravitationally collected into the lower portion in the barrel 1 especially as shown in FIG. 2 as flowing through the base perforation 635. Therefore, the vaporizable coolant 5 will perform its two-phase change self-recirculation (liquid-vapor-liquid) to efficiently dissipate the heat outwardly from CPU. The heat of vaporization or the heat of condensation of the coolant 5 is a latent heat which is greater than the sensible heat so that the present invention may dissipate much heat as produced from a CPU of a computer or electronic circuit, to thereby be superior to a conventional heat dissipation device of CPU.

The coolant is easily vaporized at low temperature especially when the system is under vacuum condition. So, even under the temperature of 30~50° C., the coolant 5 will be easily vaporized to absorb heat of vaporization to cool down the heat source (i.e. the CPU).

Figure 5:
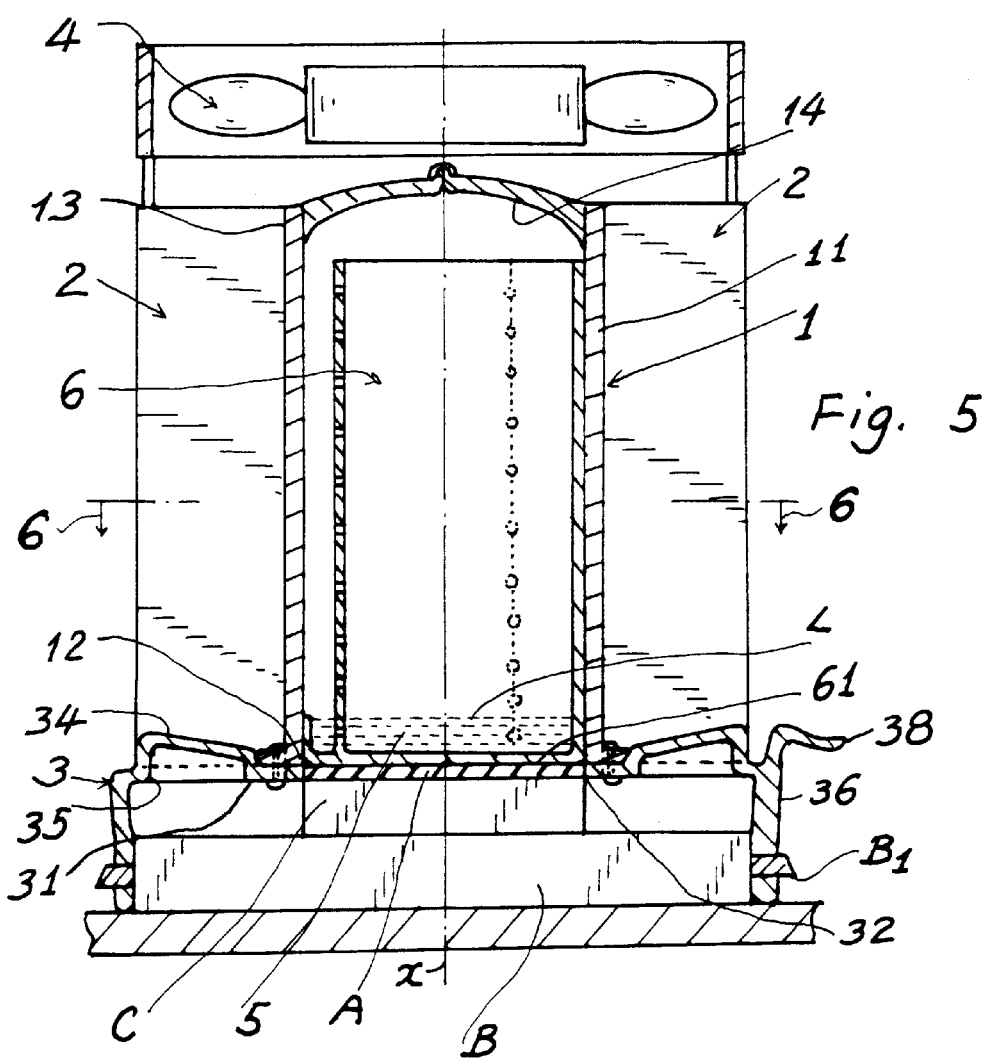
FIG. 5 is a sectional drawing of the present invention when the central processing unit is horizontally mounted.

As shown in FIGS. 5, 6, the CPU is horizontally mounted on a board and is parallel to the level L of the liquid coolant 5. Upon absorption of heat from CPU through a "bottom" end plate 61, the coolant 5 will be vaporized to become vapors which will be condensed when ejected towards the barrel wall 11 especially when contacted with an end cover 14 which is formed as dome shape or arcuate shape on the second end portion 13 of the barrel 1 to efficiently guide and drain the droplets of the condensed coolant downwardly along the barrel wall to be returned towards the bottom of the barrel for a self-recirculation of the coolant. The arcuate-shape end plate 14 will also help guide the cooling air smoothly along a streamlined surface of the end cover 14 to the barrel wall and fins for enhancing the cooling effect of the present invention.

A vent 15 is formed on the end cover 14 which is provided for sucking air outwardly from the interior in the barrel 1 to form vacuum in the barrel. Once the barrel is evacuated at vacuum, the coolant (water) is then filled into the barrel through the vent 15 which is finally sealed.

The transfer means 6 may be integrally formed with the barrel 1 during the production of the present invention. If the heat as released from CPU is not so much, the transfer means 6 may be eliminated for saving cost.

If the vaporizable coolant 5 is greatly volatile and is easily vaporized at low temperature under normal atmospheric pressure, it is not necessary to evacuate the barrel 1 to form a vacuum.

The present invention may be modified without departing from the spirit and scope of the present invention.

I claim:

1. A heat dissipating means for cooling central processing unit comprising:

a barrel having a first end portion contiguous to and secured with a central processing unit (CPU), and having a second end portion of said barrel, opposite to said first end portion, contiguous to and secured with a cooling fan;

a plurality of fins integrally and circumferentially formed on said barrel;

a buckle means secured with the first end portion of said barrel for fastening a base board of said central processing unit; and a vaporizable coolant filled and accumulated in a lower portion of said barrel which is evacuated to form vacuum before being filled with said vaporizable coolant;

whereby upon absorption of heat, which is produced from said central processing unit and thermally conducted to said barrel, by said vaporizable coolant, said coolant at a liquid state is vaporized after absorbing a heat of vaporization to become vapor to be contacted with a barrel wall which is cooled by cooling air as directed and driven by said cooling fan to said barrel wall and said fins; and upon condensation of said vapor of said coolant to be liquid coolant to liberate heat of condensation which is dissipated outwardly through the barrel wall and the fins, said liquid coolant will be gravitationally drained to the lower portion in said barrel for a self-recirculation of two phase change of said coolant to efficiently absorb and dissipate heat from said central processing unit;

said barrel integrally formed with a transfer means including a portion of said transfer means contiguous to said buckle means and connected to said central processing unit to conduct heat from said CPU through said transfer means to said barrel for vaporizing said vaporizable coolant in said barrel.

2. A heat dissipating means according to claim 1, wherein said vaporizable coolant is water.

3. A heat dissipating means according to claim 1, wherein said buckle means includes: a central disk portion secured on the first end portion of the barrel; a central hole formed through a central portion of the central disk portion for protruding an end portion of the transfer means through the central hole to be connected to the central processing unit; a plurality of bolt holes formed in the central disk portion for passing a plurality of bolts through the bolt holes and through a plurality of fixing holes each formed in a web portion formed among two neighboring fins and the first end portion of the barrel for securing the central disk portion of the buckle means with the barrel and the fins; a plurality of convex portions and concave portions alternatively circumferentially formed on the central disk portion with each said concave portion engaging each said fin and with every two said convex portions clamping each said fin in between the two convex portions; two clamping members respectively formed on opposite side portions of the central disk portion for engaging the base board of the CPU for securing the buckle means on the base board of said CPU; and at least a lug formed on one said clamping member.

4. A heat dissipating means according to claim 1, wherein said transfer means includes: a heat-conducting end plate secured on a first end portion of the barrel and protruding through a central hole of the buckle means to be joined with the CPU; a heat transfer base plate integrally formed on an inside surface of the barrel wall and being perpendicular to the heat-conducting end plate; and a guiding member connected with the heat transfer plate and the heat-conducting end plate for guiding a coolant vapor, which is vaporized from the vaporizable coolant liquid as accumulated in a lower portion of the barrel, accumulated on and heated by the heat transfer base plate in the barrel, towards an inside surface of the barrel wall, whereby upon contact of said vapor with said barrel wall as cooled, the vapor will be cooled, condensed as a liquid coolant and drained along the barrel wall to the lower portion of the barrel for a self recirculation of the coolant.

5. A heat dissipating means according to claim 4, wherein said heat-conducting end plate is formed as an arcuate convex portion protruding arcuately towards the CPU to be resiliently fastened with the CPU to enhance a buffer effect for dampening a contacting pressure between the CPU and the heat-conducting end plate for preventing damage of the CPU.

6. A heat dissipating means according to claim 4, wherein said heat-conducting end plate, the heat transfer base plate, and the guiding member of the transfer means are integrally formed and made of materials of high thermal conductivity.

7. A heat dissipating means according to claim 4, wherein said guiding member includes: a middle guiding portion tapered from the heat transfer base plate towards the barrel wall above a liquid level of the vaporizable coolant originally accumulated on the heat transfer base plate; a tapered end portion formed on an end of the middle guiding portion having a plurality of end perforations formed in the tapered end portion; a pair of side guiding portions disposed on opposite sides of the middle guiding portion each said side guiding portion inclined from each end of opposite ends of the base plate towards the middle guiding portion to be connected with a base portion of the middle guiding portion; a plurality of base perforations formed in a boundary portion between the middle guiding portion and each said side guiding portion.

8. A heat dissipating means according to claim 7, wherein said guiding member is formed as an inversed T shape.

9. A heat dissipating means according to claim 4, wherein said heat-conducting end plate is formed as an arcuate convex portion protruding towards said CPU to be resiliently fastened with said CPU when clamping said buckle means with a base board of said CPU.

10. A heat dissipating means according to claim 3, wherein each said convex portion is inclined outwardly as angularly biased from said CPU to direct a heated air streamflow outwardly from the fins to be separated from said CPU.

11. A heat dissipating means according to claim 1, wherein said barrel includes an end cover formed as a dome shape formed on a second end portion of said barrel.

* * * * *